United States Patent
He et al.

(10) Patent No.: US 11,462,491 B2
(45) Date of Patent: Oct. 4, 2022

(54) ARRAY SUBSTRATE AND MANUFACTURING METHOD THEREOF

(71) Applicant: KUNSHAN GO-VISIONOX OPTO-ELECTRONICS CO., LTD., Kunshan (CN)

(72) Inventors: Xiaoli He, Kunshan (CN); Shuai Lin, Kunshan (CN); Xiangqian Wang, Kunshan (CN); Zhihua Zhang, Kunshan (CN); Yao Li, Kunshan (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 685 days.

(21) Appl. No.: 16/330,211

(22) PCT Filed: May 25, 2018

(86) PCT No.: PCT/CN2018/088350
§ 371 (c)(1),
(2) Date: Mar. 4, 2019

(87) PCT Pub. No.: WO2019/062170
PCT Pub. Date: Apr. 4, 2019

(65) Prior Publication Data
US 2021/0335732 A1 Oct. 28, 2021

(30) Foreign Application Priority Data

Sep. 29, 2017 (CN) .......................... 201710909022.3

(51) Int. Cl.
*H01L 23/60* (2006.01)
*H01L 21/71* (2006.01)

(52) U.S. Cl.
CPC .............. *H01L 23/60* (2013.01); *H01L 21/71* (2013.01)

(58) Field of Classification Search
CPC ............ H05F 3/00; H01L 21/71; H01L 23/60
See application file for complete search history.

(56) References Cited

U.S. PATENT DOCUMENTS

| 6,013,923 A | 1/2000 | Huang |
| 10,015,916 B1* | 7/2018 | Karp ...................... H05K 3/341 |
| 2002/0101547 A1 | 8/2002 | Lee et al. |

(Continued)

FOREIGN PATENT DOCUMENTS

| CN | 1529197 A | 9/2004 |
| CN | 101145565 A | 3/2008 |

(Continued)

OTHER PUBLICATIONS

Korean Notice of Allowance dated Oct. 29, 2021, in connection with corresponding KR Application No. 9-5-2021-085444082 (4 pp., including machine-generated English translation).

(Continued)

*Primary Examiner* — Steven M Christopher
(74) *Attorney, Agent, or Firm* — Maier & Maier, PLLC

(57) ABSTRACT

An array substrate and a manufacturing method thereof are provided. A plurality of groups of bonding terminals are formed on a substrate, a first electrostatic protection wire is formed on a marginal region of the substrate, and a second electrostatic protection wire is formed to connect the bonding terminals and the first electrostatic protection wire.

10 Claims, 2 Drawing Sheets

(56) References Cited

U.S. PATENT DOCUMENTS

| | | | |
|---|---|---|---|
| 2005/0195338 A1* | 9/2005 | Matsumoto | G02F 1/136204 349/40 |
| 2007/0273801 A1* | 11/2007 | Hwang | G02F 1/136204 349/40 |
| 2008/0204618 A1* | 8/2008 | Jung | G02F 1/13452 349/40 |
| 2009/0213288 A1 | 8/2009 | Chen et al. | |
| 2010/0163284 A1 | 7/2010 | Tanahara | |
| 2011/0278574 A1 | 11/2011 | Chuang et al. | |
| 2012/0236448 A1* | 9/2012 | Hiraoka | H02H 9/046 361/56 |
| 2016/0284686 A1* | 9/2016 | Schmidt | H01L 23/60 |
| 2018/0284537 A1 | 10/2018 | Jiang et al. | |
| 2018/0286870 A1* | 10/2018 | Kim | H01L 29/7926 |

FOREIGN PATENT DOCUMENTS

| | | | | |
|---|---|---|---|---|
| CN | 101320147 A | | 12/2008 | |
| CN | 201174016 Y | | 12/2008 | |
| CN | 101923256 A | | 12/2010 | |
| CN | 101998754 A | | 3/2011 | |
| CN | 102023408 A | | 4/2011 | |
| CN | 103164080 A | | 6/2013 | |
| CN | 203616554 U | | 5/2014 | |
| CN | 104297967 A | | 1/2015 | |
| CN | 104298380 A | | 1/2015 | |
| CN | 205193390 U | | 4/2016 | |
| CN | 205334003 U | | 6/2016 | |
| CN | 106842691 A | | 6/2017 | |
| CN | 106842691 A | * | 6/2017 | G02B 5/3058 |
| JP | H06168969 A | | 6/1994 | |
| JP | H11-282386 A | | 10/1999 | |
| JP | 2000180886 A | | 6/2000 | |
| JP | 2000-347206 A | | 12/2000 | |
| JP | 2001-166338 A | | 6/2001 | |
| JP | 2002-334736 A | | 11/2002 | |
| JP | 2005517300 A | | 6/2005 | |
| JP | 2008203856 A | | 9/2008 | |
| JP | 2009205084 A | | 9/2009 | |
| JP | 2010152091 A | | 7/2010 | |
| JP | 2014186085 A | | 10/2014 | |
| JP | 2015021843 A | | 2/2015 | |
| KR | 1020080078089 A | | 8/2008 | |
| KR | 20080084221 A | | 9/2008 | |
| KR | 1020140126283 A | | 10/2014 | |
| TW | M502189 U | | 6/2015 | |

OTHER PUBLICATIONS

Japanese Office Action dated Jun. 15, 2021, in connection with corresponding JP Application No. 2019-563616 (10pp., including machine-generated English translation).
Office Action dated Apr. 8, 2020, in corresponding Chinese Application No. 201710909022.3; 17 pages.
International Search Report dated Aug. 20, 2018 in corresponding International application No. PCT/CN2018/088350; 3 pages.
Taiwanese Office Action dated Jan. 9, 2019, in connection with corresponding TW Application No. 107118512; 6 pages including Partial English-language translation.
European Search Report dated Sep. 24, 2020, in connection with corresponding EP Application No. 18862598.2; 7 pages.
Office Action dated Dec. 16, 2019, in corresponding Chinese Application No. 201710909022.3 including partial machine-generated English language translation; 16 pages.
Office Action dated Aug. 19, 2020, in corresponding Chinese Application No. 201710909022.3; 10 pages.
Japanese Office Action dated Jan. 5, 2021, in connection with corresponding JP Application No. 2019-563616 (9 pp., including machine-generated English translation).
Chinese Office Action dated Jan. 6, 2021, in connection with corresponding CN Application No. 201710909022.3 (13 pp., including machine-generated English translation).

* cited by examiner

ARRAY SUBSTRATE AND MANUFACTURING METHOD THEREOF

CROSS-REFERENCE TO RELATED APPLICATION

The application claims the benefit of priority of Chinese Patent Application No. 201710909022.3, filed on Sep. 29, 2017, and the entire disclosures of which are incorporated herein.

TECHNICAL FIELD

The present application relates to the field of panel display, specifically to an array substrate and a manufacturing method thereof.

BACKGROUND

Currently, as the panel display technology becomes increasingly mature, consumers gradually pay attention to the appearance and diversified functions of panel displays. Therefore, panel displays with narrow-bezel designs are very common in the current market. A panel display with a narrow-bezel design can be minimized in size, and at the same time can effectively provide people with a larger visual area. Therefore, the narrow-bezel design is the development trend and direction for future panel displays.

However, as the bezels are designed to be narrower, the marginal wire area becomes narrower as well, which weakens the antistatic capability. During a production process, static electricity is inevitably generated when equipment or an operator touches a product, which may easily damage the product and affect the product yield.

In the prior art, damages caused by static electricity are generally prevented through the following methods. For example, the width of a marginal ground wire is increased during the design. However, it is relatively difficult to increase the width of the wire due to the limitation of a narrow-bezel mechanism. For another example, operation technique specifications are established, which require operators to wear antistatic wrist straps; antistatic equipment such as ion fan is added; machines with good antistatic performance are purchased and ensured to be perfectly grounded for improving the antistatic capability. However, none of these methods can effectively avoid damages caused by static electricity.

Therefore, it is an urgent technical problem to be solved by persons skilled in the art to prevent electrostatic damages.

SUMMARY OF THE APPLICATION

An object of the present application is to provide an array substrate and a method for manufacturing the same, so as to avoid electrostatic damage and protect the array substrate. In order to achieve the foregoing object, the present application provides an array substrate, including a substrate, a plurality of groups of bonding terminals located on the substrate, a first electrostatic protection wire located on a marginal region of the substrate, and a second electrostatic protection wire located on the substrate, wherein each group of bonding terminals is connected to the first electrostatic protection wire via the second electrostatic protection wire.

Optionally, the substrate includes a plurality of effective regions and a peripheral region surrounding the plurality of effective regions, wherein the first electrostatic protection wire is located in the peripheral region, and the plurality of groups of bonding terminals are located in the plurality of effective regions respectively.

Optionally, the effective region includes a display region and a non-display region surrounding the display region, and the bonding terminals are located in the non-display region.

Optionally, the periphery of each effective region is provided with the first electrostatic protection wire and/or second electrostatic protection wire.

Optionally, the first electrostatic protection wire and the second electrostatic protection wire are both metal wires.

Optionally, the first electrostatic protection wire is in a closed shape of ellipse, circle or polygon.

Correspondingly, the present application further provides a manufacturing method for an array substrate, including:

providing a substrate; and forming a plurality of groups of bonding terminals on the substrate and forming a first electrostatic protection wire and a second electrostatic protection wire in a marginal region of the substrate, wherein each group of bonding terminals is connected to the first electrostatic protection wire via the second electrostatic protection wire.

Optionally, the substrate includes a plurality of effective regions and a peripheral region surrounding the plurality of effective regions, wherein the first electrostatic protection wire is formed in the peripheral region, and the plurality of groups of bonding terminals are formed in the plurality of effective regions respectively.

Optionally, the periphery of each effective region is provided with the first electrostatic protection wire and/or second electrostatic protection wire.

Optionally, the bonding terminals, forming a plurality of groups of bonding terminals on the substrate and forming a first electrostatic protection wire and a second electrostatic protection wire on a marginal region of the substrate are processed simultaneously.

Compared to the prior art, in the array substrate and the manufacturing method thereof provided in the present application, a plurality of groups of bonding terminals are formed on an substrate, a first electrostatic protection wire is formed on a marginal area of the substrate, and a second electrostatic protection wire is formed to connect the bonding terminals and the first electrostatic protection wire, so that static electricity on the bonding terminals is guided to the first electrostatic protection wire via the second electrostatic protection wire to balance and consume electricity charges, thereby achieving the purpose of effectively protecting the array substrate.

Further, forming a first electrostatic protection wire and a second electrostatic protection wire on a marginal region of the substrate and forming a plurality of groups of bonding terminals on the substrate are processed simultaneously, and therefore no processing step or processing cost is able to be added.

DETAILED DESCRIPTION

As described in the background section, a narrow area for marginal wire weakens an anti-static capability. In a production process, static electricity is inevitably generated when equipment or an operator touches a product, which may easily damage the product and affect the product yield.

In order to prevent electrostatic damage, the present application provides an array substrate, including a substrate, a plurality of groups of bonding terminals located on the substrate, a first electrostatic protection wire located on a marginal area of the substrate, and a second electrostatic protection wire located on the substrate, wherein the bonding terminals are connected to the first electrostatic protection wire via the second electrostatic protection wire.

In the array substrate provided by the present application, a plurality of groups of bonding terminals are formed on an substrate, a first electrostatic protection wire is formed on a marginal region of the substrate, and a second electrostatic protection wire is formed to connect the bonding terminals and the first electrostatic protection wire, so that static electricity on the bonding terminals is guided to the first electrostatic protection wire via the second electrostatic protection wire to balance and consume electricity charges, thereby achieving the purpose of effectively protecting the array substrate.

In order to make the content of the present application easier to be understood, the content of the present application is further described below with reference to the accompanying drawings. Definitely, the present application is not limited to the specific embodiments, and general replacements well known to persons skilled in the art also fall within the protection scope of the present application.

Then, schematic diagrams are used to illustrate the present application in detail. When illustrating the embodiment of the present application in detail, the schematic diagrams are partially enlarged without following general proportions with the purpose of facilitating the description, and the present application is not limited thereto.

Figure 1:
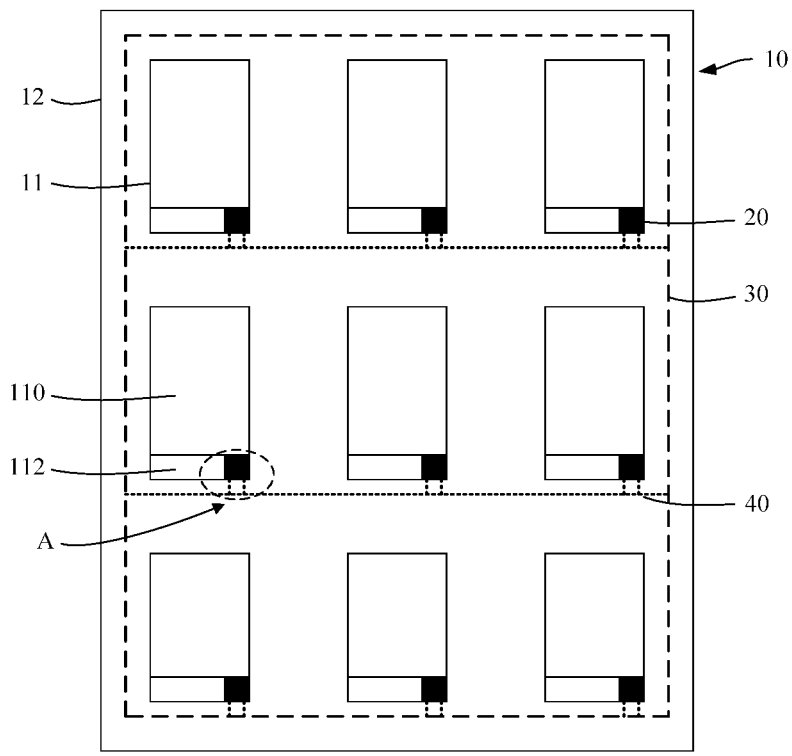
FIG. 1 is a schematic structural diagram of an array substrate according to an embodiment of the present application.

Referring to FIG. 1, which is a schematic structural diagram of an array substrate according to an embodiment of the present application. As shown in FIG. 1, the present application provides an array substrate, including an substrate 10, a plurality of groups of bonding terminals 20 located on the substrate 10, a first electrostatic protection wire 30 located on a marginal region of the substrate 10, and a second electrostatic protection wire 40 located on the substrate 10, wherein the bonding terminals 20 are connected to the first electrostatic protection wire 30 via the second electrostatic protection wire 40.

Preferably, the substrate 10 includes a plurality of effective regions 11 and a peripheral region 12 surrounding the effective regions 11. The effective regions 11 are areas for forming display screens subsequently, which are preferably rectangular, and the peripheral region 12 is an area to be discarded after subsequent cutting. That is, the substrate 10 is finally cut with the effective regions 11 being retained to form display screens and the peripheral region 12 becoming a waste material after cutting. The first electrostatic protection wire 30 is located in the peripheral region 12, and the plurality of groups of bonding terminals 20 are located in the plurality of effective regions 11 respectively.

The effective region 11 includes a display region 110 and a non-display region 112 surrounding the display region 110 (only the non-display region on one side is shown in FIG. 1). A plurality of pixels are configured in the display region 110 to form a pixel array. A plurality of metal layers are disposed in the non-display region 112 to form a peripheral circuit. Generally, each pixel includes at least a thin film transistor and a pixel electrode connected to the thin film transistor. Each pixel is surrounded by two adjacent scan lines and two adjacent data lines. The scan lines and data lines extend from the display region 110 to the non-display region 112, and are electrically connected to a driving chip through the peripheral circuit of the non-display region 112, thereby realizing normal operation of the display screen. The bonding terminals 20 are located in a bonding area of the non-display region 112 and are used to be bonded to the driving chip.

For the purpose of convenience, FIG. 1 only shows nine groups of bonding terminals 20, while the number of groups of bonding terminals 20 is not limited in other embodiments. The number of groups of bonding terminals 20 formed on the substrate is the same as the number of display screens to be formed after an array substrate is cut. That is, one display screen needs one group of bonding terminals 20. In addition, the number of bonding terminals in one group of bonding terminals 20 is also determined according to the requirement of the display screen, and is not limited in the present application.

The first electrostatic protection wire 30 and the second electrostatic protection wire 40 are both wires made of a conductive material, and are preferably metal wires. The first electrostatic protection wire 30 is located in the peripheral region 12. Due to disposing marginal wires in the peripheral region 12 being unnecessary, the wider the width of the first electrostatic protection wire 30, the better. Preferably, the width of the first electrostatic protection wire 30 is greater than 0.1 mm. The second electrostatic protection wire 40 is used for connecting the bonding terminals 20 and the first electrostatic protection wire 30. Similarly, the width of the second electrostatic protection wire 40 is preferably greater than 0.1 mm.

Figure 2:
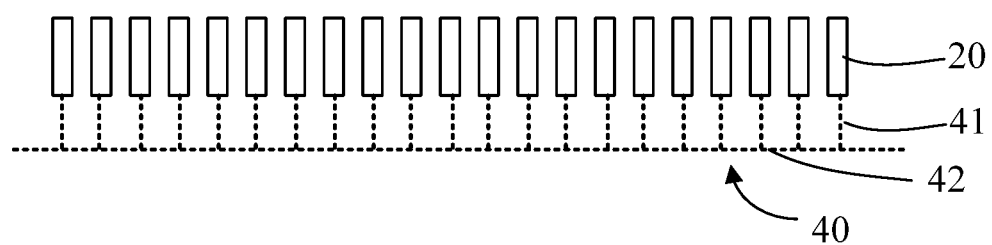
FIG. 2 is an enlarged view of point A in FIG. 1 according to an embodiment of the present application.

As shown in FIG. 1 and FIG. 2, each bonding terminal 20 is connected to the first electrostatic protection wire 30 via the second electrostatic protection wire 40. Referring to FIG. 2, which is an enlarged view of point A in FIG. 1 according to an embodiment of the present application. Each bonding terminal in each group of bonding terminals 20 is regularly arranged along a horizontal direction, and is connected to a second electrostatic protection wire extending along the horizontal direction via a second electrostatic protection wire extending along a vertical direction. That is, the electrostatic protection wire 40 includes a plurality of second electrostatic protection branches 41 arranged along a vertical direction, and the number of the second electrostatic protection branches 41 is the same as the number of bonding terminals 20 in each group. The second electrostatic protection branches 41 are one-to-one corresponded to and electrically connected to the bonding terminals 20. Besides, the second electrostatic protection wire 40 further includes a second electrostatic protection branch 42 disposed along the horizontal direction. The second electrostatic protection branches 41 are connected to the second electrostatic protection branch 42, and are finally connected to the first electrostatic protection wire 30. The plurality of second electrostatic protection branches 41 have a same line width and length, and are arranged in parallel.

In FIG. 2, each bonding terminal in each group of bonding terminals 20 is rectangular, and the bonding terminals are regularly arranged along the horizontal direction. Moreover, the short side of the bonding terminal is along the horizontal direction, and the long side thereof is along the vertical direction. However, in other embodiments, the bonding terminals may have a different shape and arrangement.

Figure 3:
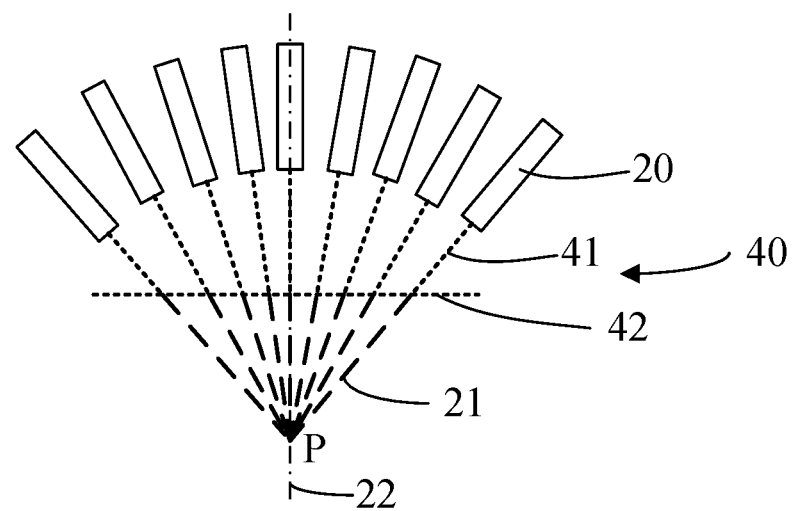
FIG. 3 is an enlarged view of point A in FIG. 1 according to another embodiment of the present application.

Referring to FIG. 3, which is an enlarged view of point A in FIG. 1 according to another embodiment of the present application. As shown in FIG. 3, each bonding terminal in each group of bonding terminals 20 is rectangular, and the bonding terminals are arranged roughly into a fan shape. Moreover, the virtual extension line 21 (preferably through central axis) along the direction of the long side of each bonding terminal forms an inclination angle with a baseline 22 (the vertical direction), and intersects the baseline 22 at a same point P. Definitely, the bonding terminals may converge outward, that is, the point P is located on a side away from the display region (as shown in FIG. 3); or the bonding terminals may diverge outward, that is, the point P is located on a side close to the display region. In a same group of bonding terminals, a virtual extension line 21 of a bonding terminal farther away from the baseline 22 forms a larger angle with the baseline 22.

In this embodiment, an area occupied by each bonding terminal may be the same, that is, each bonding terminal has a same shape and size; or the length of each bonding terminal along the direction of the baseline 30 is same. Preferably, two ends of each bonding terminal may be having a shape of triangle, wedge, trapezoid, or the like. That is, a portion of the bonding terminal which needs to be bonded to the driving chip is kept in a rectangular shape to ensure a crimping area, while the two ends of the bonding terminal are pointed to increase the gap between adjacent bonding terminals, thereby effectively preventing short-circuit between the adjacent bonding terminals.

Referring to FIG. 3, each bonding terminal in each group of bonding terminals 20 is connected to the second electrostatic protection wire extending along the horizontal direction via the second electrostatic protection wire extending along the direction of the virtual extension line 21. That is, the electrostatic protection wire 40 includes a plurality of second electrostatic protection branches 41 arranged along the direction of the virtual extension lines 21 of the bonding terminals 20, and the number of the second electrostatic protection branches 41 is the same as the number of bonding terminals 20 in each group. The second electrostatic protection branches 41 are one-to-one corresponded to and electrically connected to the bonding terminals 20. Moreover, the second electrostatic protection wire 40 further includes a second electrostatic protection branch 42 disposed along the horizontal direction. The second electrostatic protection branches 41 are connected to the second electrostatic protection branch 42, and are finally connected to the first electrostatic protection wire 30. The plurality of second electrostatic protection branches 41 may have a same width.

In this embodiment, the virtual extension line 21 along the direction of the long side of each bonding terminal intersects the baseline 22 at a same point P which is converged outward and located on a side away from the display region. Moreover, the point P is located on a side of the second electrostatic protection branch 42 which is away from the display region. In other embodiments, the point P may also be located on the second electrostatic protection branch 42, and in this case, the virtual extension lines 21 exactly coincide with the second electrostatic protection branches 41. Definitely, the point P may also be located between the display region and the second electrostatic protection branch 42, which is not limited in the present application.

Definitely, FIG. 2 and FIG. 3 are schematic enlarged views of point A in FIG. 1, which show a connection situation of the bonding terminals located at a middle position. If the bonding terminals 20 (i.e., the finally formed display screen) are located at the lower edge of the substrate 10, the second electrostatic protection branch 42 is not needed, and the second electrostatic protection branches 41 are directly connected to the first electrostatic protection wire 30.

The bonding terminals 20 are connected to the first electrostatic protection wire 30 via the second electrostatic protection wire 40. Then, in the subsequent manufacturing process, the static electricity generated by the bonding terminals 20 (or generated in the effective region 11) is able to be guided to the first electrostatic protection wire 30 through the second electrostatic protection wire 40 to balance and consume electricity charges, thereby preventing damages caused by static electricity and achieving the purpose of effectively protecting the array substrate.

It can be understood that, the static electricity can also be exported through the first electrostatic protection wire 30. For example, the first electrostatic protection wire 30 is connected to zero potential. Alternatively, a tapered portion can be formed on the first electrostatic protection wire 30, that is, one section of the first electrostatic protection wire becomes narrowed, so that static electricity is able to be easily released from the tapered portion and the releasing speed of the electrostatic charges is also able to be increased.

In this embodiment, the first electrostatic protection wire 30 is in a closed shape, such as a closed ellipse, circle or polygon, or another shape known to people skilled in the art. The polygon may be a triangle, a quadrangle, a pentagon or the like. The first electrostatic protection wire 30 being rectangular is used as an example in FIG. 1 for description, but the present application is not limited thereto. Definitely, in other embodiments, the first electrostatic protection wire 30 may also have a non-closed shape.

Figure 4:
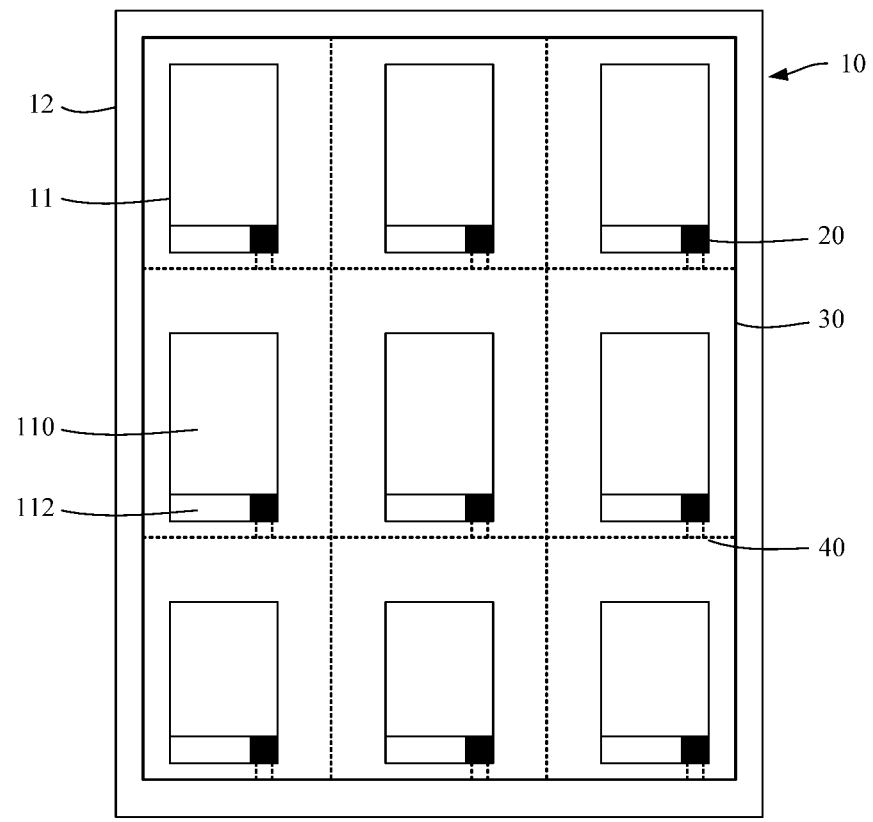
FIG. 4 is a schematic structural diagram of another array substrate according to an embodiment of the present application.

Referring to FIG. 4, which is a schematic structural diagram of another array substrate according to an embodiment of the present application. As shown in FIG. 4, the present application provides an array substrate, including an substrate 10, a plurality of groups of bonding terminals 20 located on the substrate 10, a first electrostatic protection wire 30 located on a marginal region of the substrate 10, and a second electrostatic protection wire 40 located on the substrate 10, wherein the bonding terminals 20 are connected to the first electrostatic protection wire 30 through the second electrostatic protection wire 40. In the array substrate, the periphery of each effective region 11 is provided with first electrostatic protection wire 30 and/or second electrostatic protection wire 40. As shown in FIG. 4, in this embodiment, second electrostatic protection wire 40 is also disposed between the effective regions 11 along the vertical direction, and the second electrostatic protection wire is electrically connected to the first electrostatic protection wire 30 and the second electrostatic protection wires along the horizontal direction for improving the overall area or length of the electrostatic protection wires, thereby further balancing and consuming the static electricity.

It can be understood that, the horizontal direction and the vertical direction in the present application both take the content shown in the figures as a reference standard to illustrate the present application, and do not refer to the horizontal direction and the vertical direction in an actual product. For example, the "vertical direction" in the present application may be the vertical direction in the figures or may also refer to the horizontal direction perpendicular to the vertical direction in the figures; the "horizontal direction" may be the horizontal direction in the figures or may also refer to the vertical direction perpendicular to the horizontal direction in the figures. That is, the meaning of the "horizontal direction" and the "vertical direction" in the present application is not limited to the "horizontal direction" and the "vertical direction" in the conventional sense.

Correspondingly, the present application further provides a manufacturing method for an array substrate, which is used for forming the array substrates of the foregoing two embodiments. Referring to FIG. 1 to FIG. 4, the manufacturing method for an array substrate includes:

providing a substrate 10;

forming a plurality of groups of bonding terminals 20 on the substrate 10 and a first electrostatic protection wire 30 on a marginal region of the substrate 10; and forming a second electrostatic protection wire 40 on the substrate 10, wherein the bonding terminals 20 are connected to the first electrostatic protection wire 30 via the second electrostatic protection wire 40.

Specifically, a substrate 10 is provided. The substrate 10 may be made of transparent material, for example, glass, quartz, silicon wafer, polycarbonate, polymethyl methacrylate, metal foil, or the like. The substrate 10 may be a rigid substrate or a flexible substrate. The selection and pretreatment of the substrate 10 are familiar to persons skilled in the art, and therefore are not described in detail again.

The substrate 10 includes a plurality of effective regions 11 and a peripheral region 12 surrounding the effective regions 11. The effective regions 11 are areas for forming display screens in the subsequent. The peripheral region 12 is an area to be discarded after cutting. The effective region 11 includes a display region 110 and a non-display region 112 surrounding the display region 110. The display region 110 is subsequently used for forming scan lines, data lines, transistor switches, pixel electrodes, or the like on the substrate 10. The non-display region 112 is subsequently used for forming peripheral wires on the substrate 10 to connect the scan lines, data lines, and the like on the display region 110 to a driving chip.

Next, scan lines, data lines, transistor switches, pixel electrodes, or the like are formed in the display region 110. A plurality of metal layers are formed in the non-display region 112 to form a peripheral circuit. Moreover, when bonding terminals 20 are formed in the non-display region 112, the first electrostatic protection wire 30 is formed on the marginal region (i.e., the peripheral region 12) of the substrate 10, and the second electrostatic protection wire 40 are formed on the substrate 10. The first electrostatic protection wire 30 is connected to the bonding terminals 20 via the second electrostatic protection wire 40.

Forming the first electrostatic protection wire 30 and the second electrostatic protection wire 40 and forming the bonding terminals 20 may be processed simultaneously. Definitely, the first electrostatic protection wire 30 and the second electrostatic protection wire 40 may also be formed in a same processing step as the scan lines, data lines, transistor switches or pixel electrodes in the display region 110, or as one of the plurality of metal layers in the non-display region 112. That is, forming the first electrostatic protection wire 30 and the second electrostatic protection wire 40 would not add any processing step or processing cost.

Using the bonding terminals 20 as an example, firstly, a metal layer is formed on the substrate 10, and a patterned photoresist layer is formed on the metal layer. The patterned photoresist layer exposes areas for bonding terminals, the first electrostatic protection wire 30 and the second electrostatic protection wire 40. Then, metal sputtering is performed using the patterned photoresist layer as a mask to form the bonding terminals 20, the first electrostatic protection wire 30 and the second electrostatic protection wire 40.

Therefore, the formed first electrostatic protection wire 30 and second electrostatic protection wire 40 would not add any processing step.

It can be understood that, when the first electrostatic protection wire 30 and the second electrostatic protection wire 40 are formed in the same processing step as the plurality of metal layers in the non-display region 112, the first electrostatic protection wire 30 and the second electrostatic protection wire 40 may also include plurality of layers, so as to increase cross-sectional areas of the protection wires, thereby further balancing and consuming static electricity. That is, the first electrostatic protection wire 30 and the second electrostatic protection wire 40 may include a single layer or a plurality of layers. Definitely, the first electrostatic protection wire 30 and the second electrostatic protection wire 40 may also be formed independently.

The first electrostatic protection wire 30 and the second electrostatic protection wire 40 are wires made of a conductive material, preferably metal wires, or are made of the material which is the same as that of the bonding terminals 20, pixel electrodes or the plurality of metal layers formed in the same processing step.

The scan lines and data lines extend from the display region 110 to the non-display region 112 and are electrically connected to the driving chip through the peripheral circuit of the non-display region 112, and the driving chip provides driving terminals 20 that are bonded to the non-display region 112. Therefore, static electricity generated in the effective region 11 is able to be transferred to the driving terminals 20 and then guided to the first electrostatic protection wire 30 through the second electrostatic protection wire 40, so that the electricity is balanced and consumed to achieve the purpose of effectively protecting the array.

In conclusion, in the array substrate and the manufacturing method thereof provided in the present application, a plurality groups of bonding terminals are formed on an substrate, a first electrostatic protection wire is formed on a marginal region of the substrate, and a second electrostatic protection wire is formed to connect the bonding terminals and the first electrostatic protection wire, so that static electricity on the bonding terminals is guided to the first electrostatic protection wire through the second electrostatic protection wire to balance and consume the electricity charges, thereby achieving the purpose of effectively protecting the array substrate.

Further, forming the first electrostatic protection wire and the second electrostatic protection wire and forming the bonding terminals are processed simultaneously, therefore no processing step or processing cost is able to be added.

The descriptions above are merely preferred embodiments of the present application, and are not intended to limit the scope of the present application. All changes and modifications made by those of ordinary skilled in the art according to the disclosure above should fall within the scope of the appended claims.

What is claimed is:

1. An array substrate, comprising:
   a substrate;
   a plurality of groups of bonding terminals located on the substrate and arranged in parallel;
   a first electrostatic protection wire located on a marginal region of the substrate; and
   a second electrostatic protection wire located on the substrate, wherein each group of bonding terminals is electrically connected to the first electrostatic protection wire via the second electrostatic protection wire, wherein the second electrostatic protection wire comprises a first set of second electrostatic protection branches arranged along a vertical direction and a second set of second electrostatic protection branches arranged along a horizontal direction, each of the first set of the second electrostatic protection branches having one end directly connected to a corresponding bonding terminal and the other end directly connected to a corresponding one of the second set of the second electrostatic protection branches.

2. The array substrate according to claim 1, wherein the substrate comprises a plurality of effective regions and a peripheral region surrounding the plurality of effective regions, the first electrostatic protection wire is located in the peripheral region, and the plurality of groups of bonding terminals are located in the plurality of effective regions respectively.

3. The array substrate according to claim 2, wherein the effective region comprises a display region and a non-display region surrounding the display region, and the bonding terminals are located in the non-display region.

4. The array substrate according to claim 2, wherein the periphery of each effective region is provided with the first electrostatic protection wire and/or the second electrostatic protection wire.

5. The array substrate according to claim 4, wherein the first electrostatic protection wire and the second electrostatic protection wire are both made of a conductive material.

6. The array substrate according to claim 1, wherein the first electrostatic protection wire is in a closed shape of ellipse, circle or polygon.

7. The array substrate according to claim 1, wherein each of the first electrostatic protection wire and the second electrostatic protection wire includes a plurality of layers to increase cross-sectional areas of the electrostatic protection wires.

8. The array substrate according to claim 1, wherein the first electrostatic protection wire is provided with a tapered portion that is a narrow section of the first electrostatic protection wire, from which electrostatic charges release.

9. The array substrate according to claim 1, wherein two ends of each bonding terminal have a shape of triangle, wedge, or trapezoid.

10. The array substrate according to claim 1, wherein a number of the first set of the second electrostatic protection branches is same as a number of the plurality of bonding terminals in each group.

* * * * *